United States Patent [19]

Murphy

[11] Patent Number: 4,598,820

[45] Date of Patent: Jul. 8, 1986

[54] SPRING FOR TUBULAR IC CARRIERS

[76] Inventor: Robert H. Murphy, 1 Timber La., Merrimack, N.H. 03054

[21] Appl. No.: 666,888

[22] Filed: Oct. 31, 1984

[51] Int. Cl.[4] .............................................. B65D 73/02
[52] U.S. Cl. ..................... 206/328; 206/334; 206/591; D12/159
[58] Field of Search .............. D12/159; 206/328, 334, 206/591

[56] References Cited

U.S. PATENT DOCUMENTS

| 1,016,529 | 2/1912 | Teets et al. | 206/591 |
|---|---|---|---|
| 2,851,157 | 9/1958 | Christman | 206/591 |
| 2,880,885 | 4/1959 | Willison | D12/159 |
| 2,965,371 | 12/1960 | Gulardo | 206/591 |
| 2,984,399 | 5/1961 | Gaulke | 206/591 |
| 3,415,365 | 12/1968 | Faulkner | 206/591 |
| 3,497,058 | 2/1970 | Walker et al. | 206/334 |
| 4,323,155 | 4/1982 | Kling | 206/328 |
| 4,355,719 | 10/1982 | Hinds et al. | 206/334 |
| 4,415,083 | 11/1983 | Kemkers | 206/334 |

Primary Examiner—Joseph Man-Fu Moy
Attorney, Agent, or Firm—Pearson & Pearson

[57] ABSTRACT

A plastic spring for each end of a tubular carrier, or magazine, used to transport integrated circuits, especially ceramic IC's, to secure them against sliding or chipping within the tube is formed with a finger grip, or stop pin end and an opposite IC contacting end, the ends being joined by a plurality of integral sections of flexible, resilient elastomeric material of rhombus, or diamond, shape joined along the longitudinal center line by integral webs to form a one piece, flat, thin body of uniform outside depth and width and fitting in the space between the upper and lower parallel walls of the tubular carrier. The spring is preferably carbon conductive to avoid static build-up.

6 Claims, 5 Drawing Figures

SPRING FOR TUBULAR IC CARRIERS

BACKGROUND OF THE INVENTION

It has heretofore been proposed to provide cushions, or bumpers for absorbing shock in packaging of fragile products, for example, the rubber corner mounts of U.S. Pat. No. 2,674,433 to Mautner, of Apr. 6, 1954, the resilient mounts of U.S. Pat. No. 3,269,717 to Beck of Aug. 30, 1966, the foam blocks of U.S. Pat. No. 3,275,131 to Erickson of Sept. 27, 1966, the bumpers of U.S. Pat. No. 3,635,332 to Ross of Jan. 18, 1972 and the plastic torroids of U.S. Pat. No. 3,690,540 to Hardigg of Sept. 12, 1972.

Semiconductor wafers have been cushioned during transit by a pad of plastic film stuffed with foam in U.S. Pat. No. 3,850,296 to Hirata, et al of Nov. 26, 1974.

Pills in a bottle have been cushioned by a bellows attached to a threaded cap as disclosed in U.S. Pat. No. 4,215,786 to Vertes of Aug. 5, 1980.

However, none of these expedients would be applicable, or practical, for yieldably and resiliently securing integrated circuits from sliding, chipping, or static build-up when occupying the space between the walls of an inverted U-shaped tubular carrier, or magazine.

SUMMARY OF THE INVENTION

In this invention an elongated, flat, thin spring of conductive plastic is provided which is of predetermined outside width and depth to slidably fit endwise in the space between the upper and lower parallel walls of an elongated, tubular carrier, or magazine, of inverted U shape cross section of the type used to transport integrated circuits. A finger grip is provided at one end of the one piece body of the spring and an IC contacting head is provided at the opposite end thereof, both preferably having outer flat planar surfaces. The opposite ends of the body are integrally connected by a plurality, preferably about five, sections of rhombus, or diamond, configuration, joined along the longitudinal center line by integral webs of the elastomeric material, which is preferably conductive. A spring of the invention is inserted in each opposite end of the carrier and backed up by a stop pin passing through a set of the aligned holes in the upper and lower parallel walls of the carrier to thereby secure the integrated circuits against sliding, chipping, or static build-up. The spring is longitudinally compressible and laterally expansible, and in one embodiment may have an elongated finger grip end with one or more holes therethrough to receive the stop pin.

DESCRIPTION OF A PREFERRED EMBODIMENT

Figure 1:
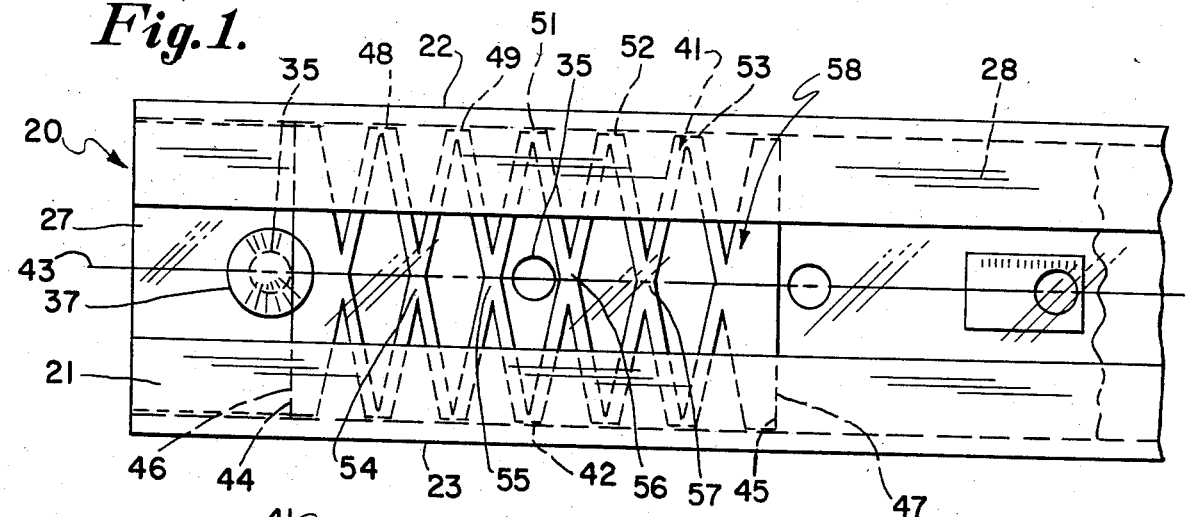
FIG. 1 is a fragmentary top plan view of one end of a tubular carrier with a spring of the invention in place between an integrated circuit and a stop pin.
Figure 2:
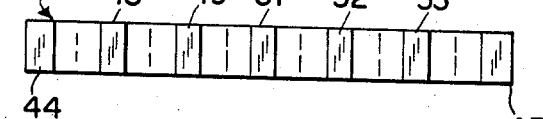
FIG. 2 is a side elevation of the spring shown in FIG. 1.
Figure 3:
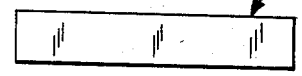
FIG. 3 is an end elevation of the spring shown in FIG. 2.

In the drawing, a tubular carrier, or magazine, 20 is of inverted U shaped configuration and has a top longitudinal wall 21, outer side walls 22 and 23, inner side walls 24 and 25, and a bottom longitudinal wall 26, all integrally formed and the central longitudinal section 27 of the top wall 21 is transparent. The carrier 20 is an extruded tubing and is preferably formed of carbon conductive material, or coated with antistatic coating, for continuous grounding to eliminate static build-up.

The circuit elements 28 are inserted in the space 29 between top wall 21, and bottom wall 26, with their depending legs such as 31 and 32 inserted in the spaces, or channels, 33 and 34 between the side walls 22 and 24, and 23 and 25 respectively wherein they are protected from bending or other injury. The top and bottom walls 21 and 26 are provided with aligned sets, or pairs, or vertically aligned holes such as 35 and 36 for receiving stop pins such as 37.

The cushioning device 41, of the invention, is an elongated, one piece, flat, thin, elastomeric, plastic, body 42 of uniform outer width and depth dimensioned to slidably fit within the space 29, between the top wall 21 and the bottom wall 26 of a carrier, or magazine, 20. It will be understood that carriers are made in different sizes and dimensions so that the cushioning devices 41 are also made in corresponding dimensions and sizes to fit therein. Each device 41 has a longitudinal central axis designated 43, an outer end 44 shaped as a finger grip, an opposite inner end 45 shaped to flatwise engage an integrated circuit and each end has a flat planar outer surface 46 or 47. Preferably the outer ends and inner ends 44 and 45 are identical in configuration so that the device may be used either end facing in or facing out.

The device 41 includes a plurality of substantially identical, individual rhombus, or diamond, shaped sections 48, 49, 51, 52 and 53, integral with and extending between the ends 44 and 45 to resemble a stack of double elliptical springs, joined together by the central webs 54, 55, 56 and 57. The device 41 is of slightly less outer width than the width of the space 29, and the rhombus shaped sections being of flexible, resilient material, the spring 58 formed by the multiple rhombus shaped sections, when located between an element 28 and a stop pin 37, is longitudinally compressible and laterally expansible to yieldably and resiliently absorb shocks during transport while securing ceramic, or other elements 28, against sliding, chipping, or other damage.

Preferably each device 41 is of carbon conductive material to avoid static build-up, and preferably the outer surfaces 46 and 47 of the ends 44 or 45 are normal to the longitudinal axis 43.

Figure 4:
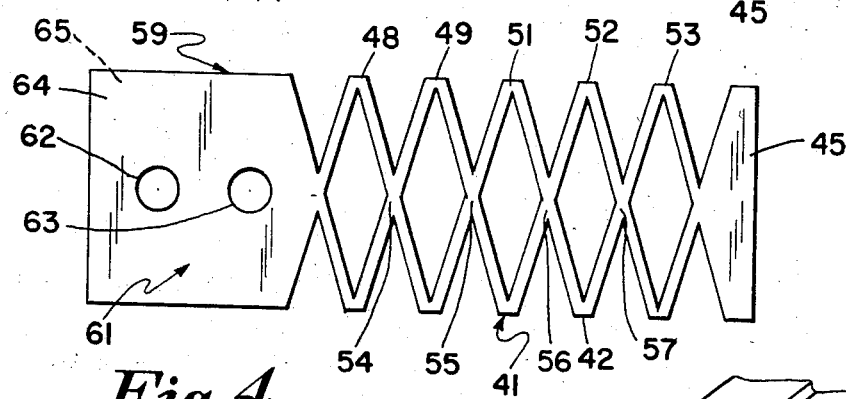
FIG. 4 is a top plan view of another embodiment of the spring of the invention.
Figure 5:
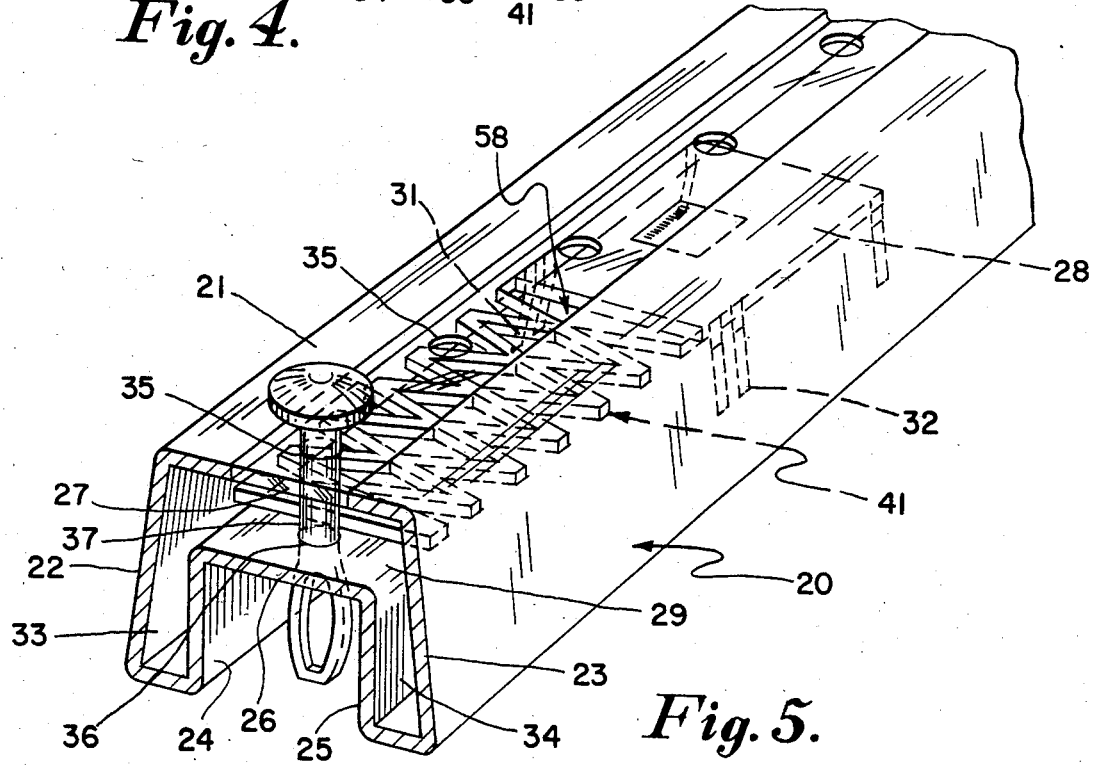
FIG. 5 is a perspective view of the carrier, stop pin, spring and integrated circuit shown in FIG. 1.

As shown in FIG. 4 in another embodiment 59 of the cushioning device of the invention, the end 45, the individual rhombus shaped sections 48, 49, 51, 52, and 53 and webs 54, 55, 56, and 57, are identical with those disclosed in FIGS. 1, 2, 3 and 5, but the other opposite finger grip end 61 is elongated, flat, and solid except for one or more stop pin holes such as 62 and 63 for receiving a stop pin 37. Device 61 has a flat upper surface 64, and a flat lower surface 65, and the holes 62 and 63 extend through the material from one said surface to the other.

I claim:

1. A device for insertion in one of the opposite ends of a tubular carrier for integrated circuits, to secure the same from sliding and chipping therein during transport, said device comprising:

an elongated, longitudinally flat, thin one piece rectangular elastomeric plastic body, said body comprising a length, a width and a thickness, said width being smaller than said length but larger than said thickness, said body having a longitudinal, central axis, one end shaped as a finger grip, an opposite end shaped to flatwise engage an integrated circuit, and having a plurality of integral rhombus shaped sections extending between said ends, to form a longitudinally compressible, laterally expansible spring adapted to yield, widen and compress to serve as a shock absorber for integrated circuits slidably housed in said tubular carrier.

2. A device as specified in claim 1 wherein: said plastic body is carbon conductive.

3. A device as specified in claim 1 wherein: each said end of said body includes a substantially flat, planar, outer end surface extending normal to the longitudinal central axis of the body.

4. A device as specified in claim 1 wherein: said one end shaped as a finger grip is of solid said material, elongated, and with flat planar upper and lower surfaces, and includes at least one hole therethrough from upper to lower surface for receiving a stop pin.

5. A device for use with a circuit element tubular carrier, or magazine, the carrier having opposed top and bottom longitudinal walls between which a circuit element may be slidable inserted and held and having opposite side channels in which connector side legs of the element may be held, said element being thus held in the carrier for slidable longitudinal motion, said carrier top and bottom walls having pairs of vertically aligned central holes, each pair of like diameter and longitudinally spaced for receiving stop pins, said device comprising:

an elongated, one piece longitudinally rectangular flat, thin body of elastomeric material, said body comprising a length, a width and a thickness, said width being smaller than said length but larger than said thickness, said body having an outer end, and an inner end, each with a flat planar outer surface, and a plurality of substantially rhombus, or diamond shaped sections forming an integral stack connecting said ends, said body forming a longitudinally compressible and laterally expansible longitudinally flat, thin spring insertable between said top and bottom longitudinal walls of said carrier to secure and circuit elements from sliding or chipping when said spring is backed up by one of said stop pins.

6. A cushioning device for insertion in the space between the parallel, spaced apart walls of inverted, U shaped, extruded, tubing protectively packaging integrated circuits to prevent sliding, chipping, or static build-up of said circuits, and device comprising:

an elongated longitudinal rectangular flat, thin plastic spring of carbon conductive material having an outer end and an inner end, each with a flat planar surface, said ends being connected by an integral, elongated stack of individual, rhombus, or diamond, shaped sections, joined to each other only at the center thereof; said spring including a length, a width and a thickness, said width being smaller than said length but larger than said thickness said spring being longitudinally compressible and laterally expansible in said space to resiliently and flexibly retain said circuits in position to secure the same against sliding, chipping, or static build-up.

* * * * *